United States Patent [19]

Frank

[11] Patent Number: 5,517,145

[45] Date of Patent: May 14, 1996

[54] CMOS TOGGLE FLIP-FLOP USING ADIABATIC SWITCHING

[75] Inventor: David J. Frank, Yorktown Heights, N.Y.

[73] Assignee: International Business Machines Corporation, Armonk, N.Y.

[21] Appl. No.: 332,542

[22] Filed: Oct. 31, 1994

[51] Int. Cl.[6] .................................................. H03K 3/037
[52] U.S. Cl. ........................ 327/201; 327/208; 327/213; 327/215
[58] Field of Search .................................. 327/199, 200, 327/201, 208, 213, 215

[56] References Cited

U.S. PATENT DOCUMENTS 5,378,940   1/1995   Knight, Jr. et al. ................... 327/199

*Primary Examiner*—Margaret Rose Wambach
*Attorney, Agent, or Firm*—Robert M. Trepp

[57] ABSTRACT

A toggle flip-flop circuit is described incorporating eight bi-directional switches which may be dual rail wherein each bi-directional switch for each rail includes an n and p channel transistor coupled in parallel. Clock input signals may have rise and fall times longer than the RC time constant of a bi-directional switch and node capacitance being charged which dissipates very low power across the switch. The invention provides a practical toggle flip-flop circuit using adiabatic switching for very low power dissipation.

11 Claims, 6 Drawing Sheets

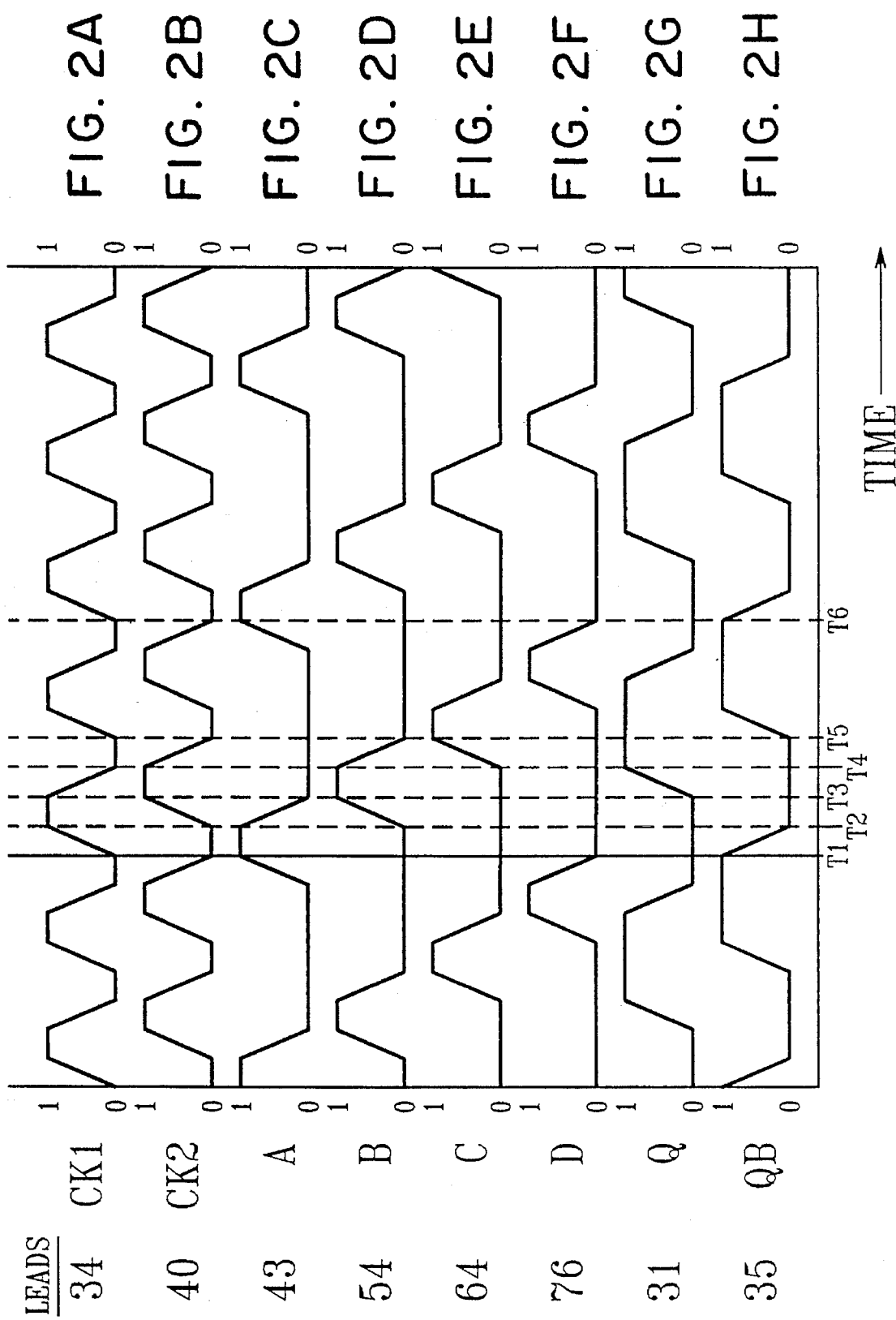

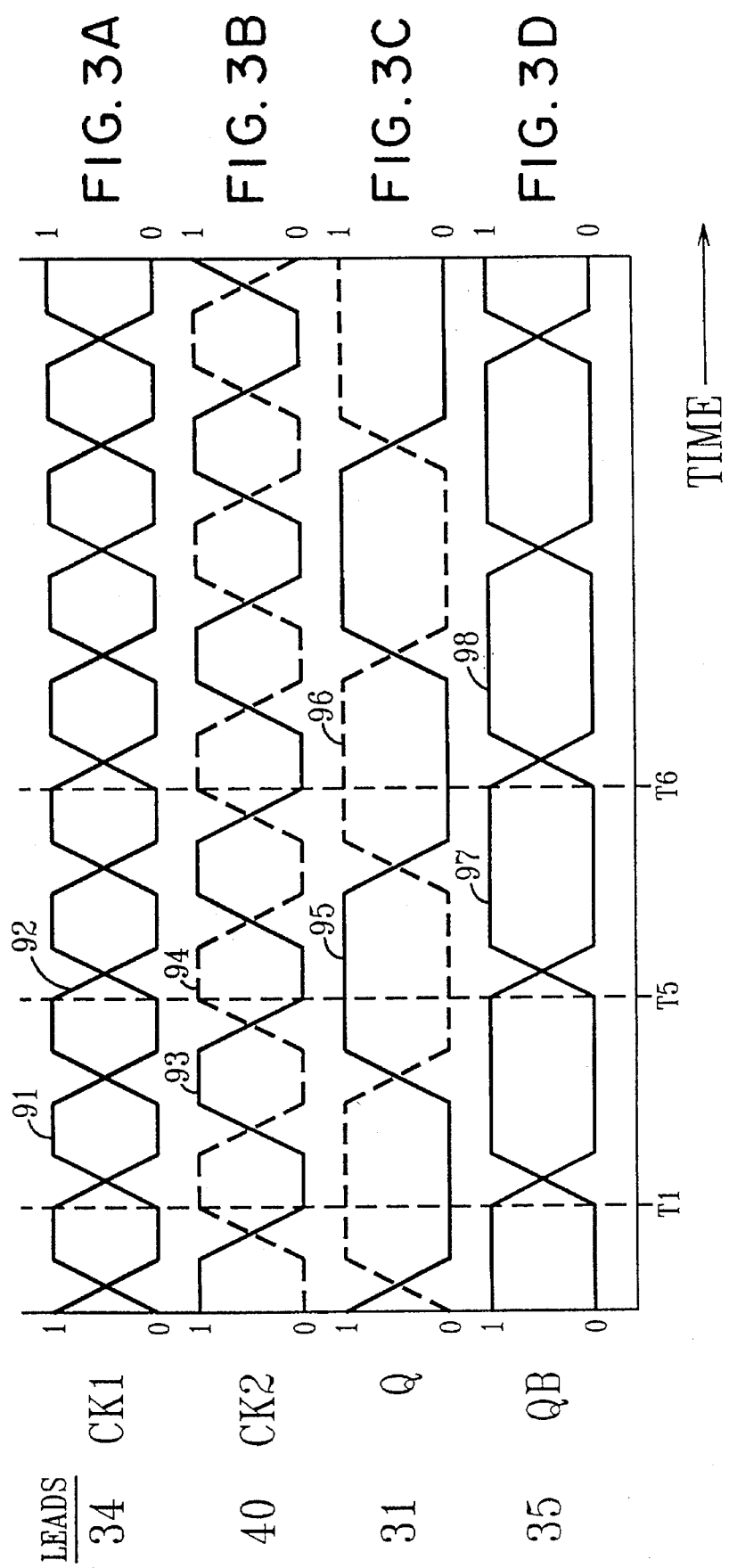

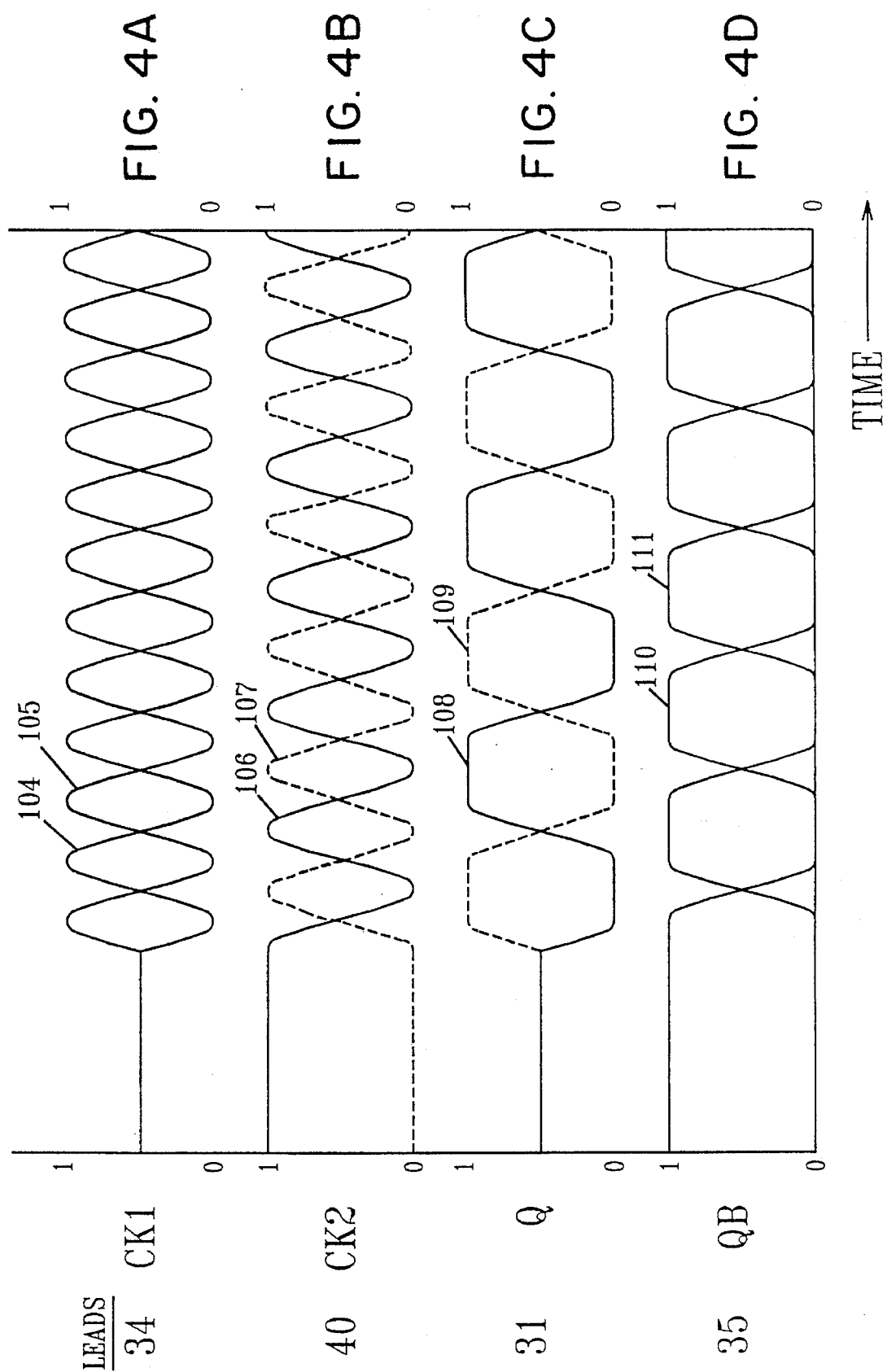

CM OS TOGGLE FLIP-FLOP USING ADIABATIC SWITCHING

FIELD OF THE INVENTION

This invention relates to logic circuits and more particularly to a low power toggle flip-flop which uses adiabatic switching.

BACKGROUND OF THE INVENTION

The ideas of reversible computation have been around for some time such as described in a publication by C. H. Bennett entitled "Notes on the History of Reversible Computation," IBM J. Res. Develp. 32, p. 16 (1988). In reversible computation, the energy dissipation required to erase data is avoided by saving the intermediate data until a later time when the computation, or a subset of it, can be run backwards and the data can be dissipationlessly un-computed. Most of the proposed implementations have been impractical. Recently, electronic implementations have been suggested using adiabatic switching and electroid switches as described in a publication by J. S. Hall entitled "An Electroid Switching Model for Reversible Computer Architectures," Proc. Workshop on Physics and Computation, Oct. 1992 (IEEE Comp. Soc. Press, 1993), p. 237.

There is a growing demand for low power, high performance electronics, especially for battery-powered applications. One possible way of addressing this demand is through the use of adiabatic switching techniques combined with reversible computing schemes. In adiabatic switching, the voltage is the same on both sides of a switch before the switch is closed. The most readily apparent advantage of adiabatic switching techniques combined with reversible computing schemes is that the energy consumption per switching operation decreases as the duration of the switching event increases, unlike conventional CMOS circuits, in which the energy per switching event remains essentially constant.

SUMMARY OF THE INVENTION

In accordance with the present invention, a toggle flip-flop circuit consisting of dual rail logic wherein one rail is described comprising first through eighth bi-directional switches, each bi-directional switch including a p and n channel field effect transistor, each field effect transistor having a gate, source and drain, the drain of the p channel field effect transistor and a source of the n channel field effect transistor coupled together at a first terminal and a source of the p channel field effect transistor and the drain of the n channel field effect transistor coupled together at a second terminal, the first, second, fourth and third bi-directional switches coupled in series in a ring by interconnecting first and second terminals of respective switches, the interconnection between the fourth and third bi-directional switches adapted for coupling to an input signal CK1, the interconnection between the first and second bi-directional switches adapted for coupling to an input signal $\overline{CK1}$, the interconnection between the second and fourth bi-directional switches connected to the inverted control input of the fifth bi-directional switch and to the control input of the seventh bi-directional switch and provides an output signal, the interconnection between the first and third bi-directional switches connected to the inverted control input of the sixth bi-directional switch and to the control input of the eight bi-directional switch and provides an output signal $\overline{Q}$, an input signal CK2 coupled through said eight bi-directional switch to a control input of the fourth bi-directional switch and through the sixth bi-directional switch to a control input of the second bi-directional switch, and an input signal $\overline{CK2}$ coupled through the seventh bi-directional switch to a control input of the third bi-directional switch and through the fifth bi-directional switch to a control input of the first bi-directional switch.

The invention provides a toggle flip-flop circuit which dissipates very low power at times input signals CK1, $\overline{CK1}$, CK2, and $\overline{CK2}$ ramp from 0 to 1 or from 1 to 0 logic state slower than the RC time constant of the voltage node being switched in the flip-flop where C is the capacitance of the voltage node and R is the resistance of the bi-directional switch which is closed and conducting current from input signal CK1 or $\overline{CK1}$.

The invention further provides adiabatic switching within the toggle flip-flop by causing bi-directional switches to switch only at times when there is no voltage difference across the switch.

The invention further provides additional field effect transistors to allow static operation of the toggle flip-flop holding their respective nodes at the proper potentials during times when the nodes would otherwise be floating. The additional field effect transistors might be unnecessary under some operating conditions where the toggle flip-flop is regularly clocked, resulting in dynamic operation of the flip-flop.

The invention further provides a dual rail toggle flip-flop circuit where inverted signals are always available simply by switching the rails.

The invention further provides a toggle flip-flop where only one of four switches is closed during any one transition of input signal CK1.

BRIEF DESCRIPTION OF THE DRAWING

These and other features, objects, and advantages of the present invention will become apparent upon consideration of the following detailed description of the invention when read in conjunction with the drawing in which:

FIGS. 2A rough 2H show typical waveforms for the proper operation of the embodiment of FIG. 1.

FIGS. 3A through 3D show input and output waveforms of the embodiment of FIG. 1 where both rails of each signal are shown.

FIGS. 4A and 4B show sine wave inputs for CK1 and CK2 where both rails of each signal are shown.

FIGS. 4C and 4D show output waveforms for the embodiment of FIG. 1 where both rails of each signal are shown.

DESCRIPTION OF THE PREFERRED EMBODIMENT

Figure 1A:
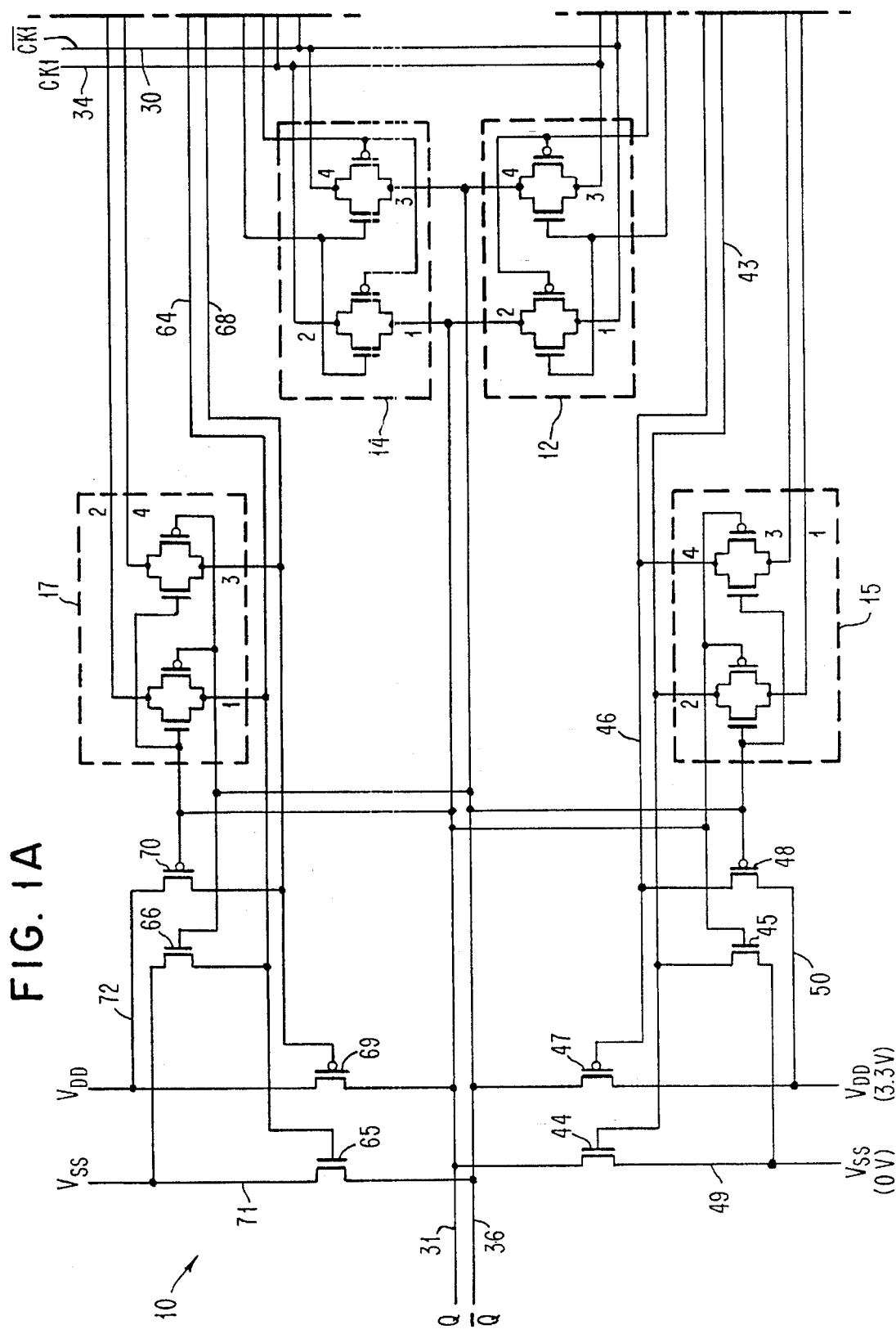
FIG. 1 is one embodiment of the invention.
Figure 1B:
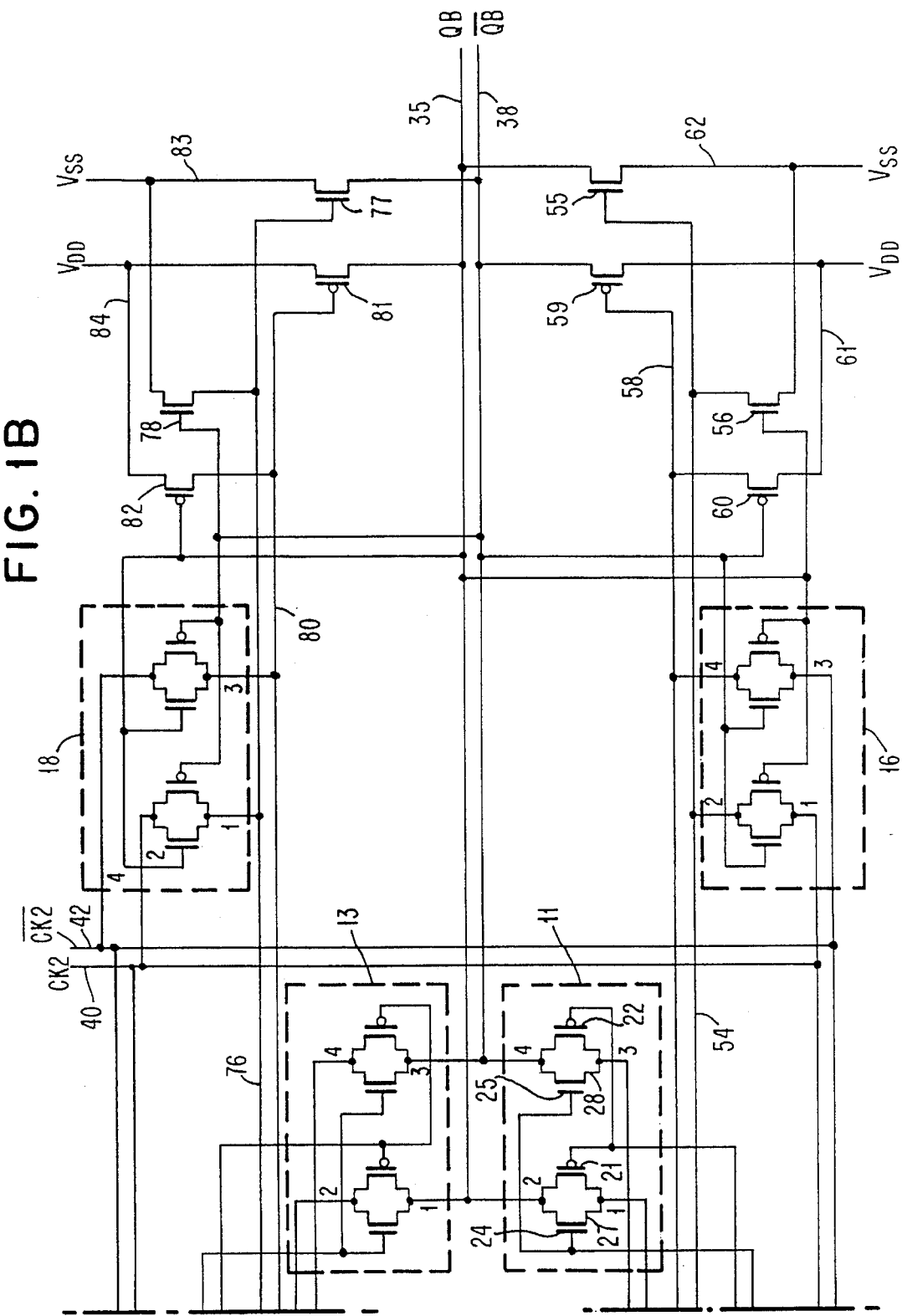

Referring now to the drawing, FIG. 1 shows a schematic circuit of toggle flip-flop 10. Toggle flip-flop 10 includes eight dual bi-directional switches: switches 11, 12, 13, 14, 15, 16, 17 and 18. Switch 11 consists of switch or transmission gate 27 and switch or transmission gate 28 for handling respective rails of dual rail logic. Switch or transmission gate 27 has current passing through terminals one and two and switch or transmission gate 28 has current passing through terminals three and four.

Each switch, such as switch 11 shown in FIG. 1, includes two p channel field effect transistors 21 and 22 and two n channel field effect transistors 24 and 25. Each field effect transistor has a gate, source and drain associated therewith. The drain of p channel transistor 21 is coupled to the source of n channel transistor 24 to form a first terminal of switch 11. The drain of n channel transistor 24 and the source of p channel transistor 21 are coupled together to form a second terminal of switch 11. The source of n channel transistor 25 and the drain of p channel 22 are coupled together to form a third terminal of switch 11. The drain of n channel transistor 25 and the source of p channel transistor 22 are coupled together to form a fourth terminal of switch 11. Switches 12 through 18 are the same as switch 11 and each has four terminals which are numbered the same as switch 11.

Switches 11, 12, 14 and 13 are coupled in series in a ring. Terminal 1 of switch 11 is coupled to terminal 1 of switch 12 over lead 30 and to input signal $\overline{CK1}$. Terminal 2 of switch 12 is coupled to terminal 1 of switch 14 over lead 31 and to an output terminal for output signal Q. Terminal 2 of switch 14 is coupled to terminal 2 of switch 13 over lead 34 and to an input signal terminal for input signal CK1. Terminal 1 of switch 13 is coupled to terminal 2 of switch 11 over lead 35 and to an output terminal for output signal $\overline{QB}$.

Terminal 3 of switch 11 is coupled over lead 34 to terminal 3 of switch 12 and to input signal CK1. Terminal 4 of switch 12 is coupled over lead 36 to terminal 3 of switch 14 and to an output terminal for output signal $\overline{Q}$. Terminal 4 of switch 14 is coupled over lead 30 to terminal 4 of switch 13 and to input signal $\overline{CK1}$. Terminal 3 of switch 13 is coupled over lead 38 to terminal 4 of switch 11 and to an output terminal for output signal $\overline{QB}$.

Input control signal CK2 is coupled over lead 40 to terminal 3 of switch 15, terminal 1 of switch 16, terminal 4 of switch 17 and terminal 2 of switch 18. Input control signal $\overline{CK2}$ is coupled over lead 42 to terminal 1 of switch 15, terminal 3 of switch 16, terminal 2 of switch 17 and terminal 4 of switch 18.

Terminal 2 of switch 15 is coupled to the gate of n channel transistors 24 and 25 of switch 11, to the gate of transistor 44 and the drain of transistor 45. Terminal 4 of switch 15 is coupled over lead 46 to the gate of p channel transistors 21 and 22 of switch 11 and to the gate of transistor 47 and the source of transistor 48. The source of transistors 44 and 45 are coupled over lead 49 to voltage $V_{SS}$ which may be zero volts or ground potential. The drain of transistors 47 and 48 are coupled over lead 50 to voltage $V_{DD}$ which may be, for example, +3.3 volts. The drain of transistor 44 is coupled over lead 31 to output signal Q. The source of transistor 47 is coupled over lead 36 to output signal $\overline{Q}$.

The second terminal of switch 16 is coupled over lead 54 to the gate of the two n channel transistors of switch 12, to the gate of transistor 55 and to the drain of transistor 56. The fourth terminal of the switch 16 is coupled over lead 58 to the gate of two p channel transistors of switch 12, to the gate of transistor 59 and to the source of transistor 60. The drain of transistors 59 and 60 are coupled over lead 61 to voltage $V_{DD}$. The source of transistors 55 and 56 are coupled over lead 62 to voltage $V_{SS}$. The source of transistor 59 is coupled over lead 38 to output signal $\overline{QB}$. The drain of transistor 55 is coupled over lead 35 to output signal QB.

The first terminal of switch 17 is coupled over lead 64 to the gate electrode of the two n channel transistors of switch 13, to the gate electrode of transistor 65 and to the source electrode of transistor 66. Terminal 3 of switch 17 is coupled over lead 68 to two p channel transistors of switch 13, to the gate of transistor 69 and to the drain of transistor 70. The drain of transistors 65 and 66 are coupled over lead 71 to voltage $V_{SS}$. The source of transistors 69 and 70 are coupled over lead 72 to voltage $V_{DD}$. The source of transistor 65 is coupled over lead 36 to output signal $\overline{Q}$. The drain of transistor 69 is coupled over lead 31 to output signal Q.

Terminal 1 of the switch 18 is coupled over lead 76 to the gate of two n channel transistors of switch 14, to the gate of transistor 77 and to the source of transistor 78. Terminal 3 of switch 18 is coupled over lead 80 to the gate of the two p channel transistors of switch 14, to the gate of transistor 81 and to the drain of transistor 82. The source of transistor 77 is coupled over lead 38 to output signal $\overline{QB}$. The drain of transistors 77 and 78 are coupled over lead 83 to voltage $V_{SS}$. The source of transistors 81 and 82 are coupled over lead 84 to voltage $V_{DD}$. The drain of transistor 81 is coupled over lead 35 to output signal QB.

Leads 50, 61, 72 and 84 may be the same lead which is coupled to $V_{DD}$. Leads 49, 62, 71 and 83 may be the same lead which is coupled to $V_{SS}$.

Transistors 44, 45, 55, 56, 65, 66, 77 and 78 may be n channel field effect transistors. Transistors 47, 48, 59, 60, 69, 70, 81 and 82 may be p channel field effect transistors. These n and p channel transistors function to allow static operation of toggle flip-flop 10 by holding their respective circuit nodes at the proper potential during times when they would otherwise be floating. These n and p channel transistors may not be necessary under some conditions where the toggle flip-flop 10 is regularly clocked by input signals CK1, $\overline{CK1}$, CK2 and $\overline{CK2}$, thus resulting in dynamic operation and restoring of voltages on circuit nodes. For dynamic operation where the flip-flop is regularly clocked, bi-directional switches 11 through 18 shown in FIG. 1 would be sufficient to embody the toggle flip-flop.

FIGS. 2A through 2H show typical waveforms for the proper operation of toggle flip-flop 10 in FIG. 1. In FIGS. 2A through 2H the ordinate represents voltage and the abscissa represents time.

Toggle flip-flop 10 has two rails of logic for each signal; one rail of logic corresponds to terminals 1 and 2 of bi-directional switches 11 through 18 and the second rail of logic corresponds to terminals 3 and 4 of bi-directional switches 11 through 18. FIGS. 2A through 2H show waveforms for one rail of logic corresponding to terminals 1 and 2 of dual bi-directional switches 11 through 18. The second rail of logic always has a waveform that is the complement of the signal on the first rail of logic. The switch associated with terminals one and two of dual bi-directional switches 11 through 18 is closed when the input to the n channel transistor i.e. transistor 24 is high or a logic one, and open when the input is low or a logic zero.

Input signals CK1 on lead 34 shown in FIG. 2A and input signal CK2 on lead 40 shown in FIG. 2B are ramped up and down slower than the RC time constant where R is the resistance of the respective switch and C is the capacitance of the circuit node being driven so that very little voltage will appear across the respective dual bi-directional switch, which is an essential characteristic of adiabatic switching. The dual bi-directional switches are closed only when there is no voltage difference across the switch terminals.

Switches 11 through 14 allow the connection of signal CK1 or $\overline{CK1}$ to output signal Q on lead 31 shown in FIG. 2G and output signal QB on lead 35 shown in FIG. 2H. Only one of switches 11 through 14 is closed during any one transition of input signal CK1. The switch that is closed is determined by signals on lead 43 shown in FIG. 2C, lead 54 shown in FIG. 2D, lead 64 shown in FIG. 2E and lead 76 shown in FIG. 2F. The logic state of leads 43, 54, 64 and 76 are determined by switches 15 through 18 which connect leads 43 and 64 to input signal $\overline{CK2}$ and which connect leads 54 and 76 to input signal CK2 at the appropriate time.

Referring to FIGS. 2A to 2H, at time T1 lead 43 and output signal QB on lead 35 are both logic 1. Leads 34, 40, 54, 64, 76 and 31 are a logic 0. Switches 11, 18 and 15 are closed and switches 12–14, 16 and 17 are open. Next, after time T1 and before time T2, input signal CK1 ramps up to a logic 1 and $\overline{CK1}$ ramps down to a logic zero. Since signal QB on lead 35 is attached to $\overline{CK1}$ through switch 11, output signal QB on lead 35 is also ramped down to logic zero. If the ramp down or fall time of signal $\overline{CK1}$ is slow compared to the RC time constant where R is a resistance of switch 11 and C is the capacitance attached to lead 35, very little energy (about $CV^2RC/T$, where T is the time duration of the ramp) is dissipated in switch 11, and most of the energy, is returned to the input signal $\overline{CK1}$, lead 34. As signal QB on lead 35 falls or ramps down to logic zero, signal QB turns off switch 18 and transistor 56. Signal $\overline{QB}$ turns off transistor 60. Signal $\overline{QB}$ on lead 38 turns on or closes switch 16 and transistor 78. At time T2, lead 34 is a logic 1 as well as lead 43, and leads 40, 54, 64, 76, 31 and 35 are a logic 0. As switch 16 is turned on, no current flows through its transmission gates since signal CK2 on lead 40 is a logic 0 and lead 54 is a logic 0. As transistor 78 is turned on, no current flows through transistor 78 since lead 76 is a logic 0 throughout the transition.

After time T2 and before time T3, signal CK2 on lead 40 ramps up or rises from a logic 0 to a logic 1 while signal CK1 on lead 34 remains a logic 1. Signal $\overline{CK2}$ on lead 42 ramps down, and since signal Q on lead 36 is a logic 1, switch 15 is closed causing lead 43 to ramp down from a logic 1 to a logic 0 turning off switch 11. With switch 16 closed due to signal $\overline{QB}$ being a logic 1, signal CK2 passes through switch 16 causing lead 54 to ramp up from a logic 0 to a logic 1 causing switch 12 to close. Since signal $\overline{CK1}$ and Q on lead 31 are both low or a logic 0, no current flows through switch 12 when bi-directional switch 12 is closed.

Next, between time T3 and time T4, signal CK1 ramps down from a logic 1 to a logic 0 and $\overline{CK1}$ on lead 40 ramps up from a logic 0 to a logic 1 causing signal Q on lead 31 to ramp up to a logic 0 from a logic 1 by way of switch 12 which is closed. This turns off switch 15 and turns on switch 17. Signal CK2 remains high during this time from time T3 to time T4. At time T4, signal CK1 on lead 34, lead 43, lead 64, lead 76 and lead 35 are a logic 0. At time T4, signal CK2 on lead 40, lead 54 and signal Q on lead 31 are a logic 1.

Between time T4 and time T5, signal CK2 on lead 40 ramps down from a logic 1 to a logic 0 and $\overline{CK2}$ on lead 42 ramps up from a logic 0 to a logic 1 which passes through switch 17 to cause lead 64 to ramp up from a logic 0 to a logic 1. Lead 64 causes switch 13 to close. Lead 54 is ramped down from a logic 1 to a logic 0 by way of bi-directional switch 16 and signal CK2 on lead 40, causing switch 12 to open. At time T5, signal CK1 on lead 34, signal CK2 on lead 40, lead 43, lead 54, lead 76 and signal QB on lead 35 are a logic 0. At time T5 lead 64 and signal Q on lead 31 are a logic 1. Time T5 corresponds to the end of a cycle which began at time T1. Additional cycles from T1 through T5 may be executed as shown in FIGS. 2A through 2H by additional clock pulses from signals CK1 and CK2.

At time T6 another cycle would be completed starting from time T5.

FIGS. 3A and 3B show input waveforms for signal CK1 on lead 34 and CK2 on lead 40. FIGS. 3C and 3D show output waveforms of signal Q on lead 31 and signal QB on lead 35. In FIGS. 3A through 3D the ordinate represents voltage and the abscissa represents time. In FIG. 3A, curve 91 shows signal CK1 and curve 92 shows signal $\overline{CK1}$. In FIG. 3B waveform 93 shows signal CK2 and waveform 94 shows signal $\overline{CK2}$. In FIG. 3C, waveform 95 shows signal Q and waveform 96 shows signal $\overline{Q}$. In FIG. 3D, waveform 97 shows signal QB and waveform 98 shows signal $\overline{QB}$. FIGS. 3A through 3D show both rails of each signal for operation of toggle flip-flop 10 shown in FIG. 1. As shown in FIGS. 3A through 3D, toggle flip-flop 10 is performing a divide-by-2 function. As for reversibility of toggle flip-flop 10, the output Q and QB versus time can be exactly reversed by reversing the relative phase of signal CK1 on lead 34 and signal CK2 on lead 40.

If the threshold voltages of the n and p channel transistors in switches 11 through 18 of toggle flip-flop 10 shown in FIG. 1 are adjusted such that the threshold voltage of the n channel field effect transistor is equal to the negative of the threshold voltage of the p channel transistor, and if the magnitude of the threshold voltage of the n channel transistor and the p channel transistors are equal to $V_{DD}/2$ or substantially $V_{DD}/2$, then toggle flip-flop 10 may operate adiabatically (i.e., with very low energy loss) even with sine wave inputs for signal CK1 and signal CK2. Equivalently, the power supply voltage $V_{DD}$ may be adjusted to be twice the threshold voltage of the n channel field effect transistors and/or the p channel field effect transistors.

FIGS. 4A through 4D simulate the operation of toggle flip-flop 10 where input signals CK1 and CK2 are sine waves as shown in FIGS. 4A through 4D. In FIGS. 4A through 4D the ordinate represents voltage and the abscissa represents time. In FIG. 4A, signal CK1 is shown by waveform 104 and signal $\overline{CK1}$ is shown by waveform 105. In FIG. 4B, signal CK2 is shown by waveform 106 and signal $\overline{CK2}$ is shown by waveform 107. In FIG. 4C, signal Q on lead 31 is shown by waveform 108 and signal $\overline{Q}$ on lead 36 is shown by waveform 109. In FIG. 4D, signal QB on lead 34 is shown by waveform 110 and signal $\overline{QB}$ on lead 38 is shown by waveform 111. In FIGS. 4A through 4D, the voltage supply $V_{DD}$ is set at twice the threshold voltage of the n or p channel field effect transistors. Under these circumstances, switches 11–18 all reach the threshold voltage of the transistors therein and switch on or off at the half way point of the signals being applied to the gates of the p and n channel field effect transistors. By construction, switch timing always corresponds to a minimum logic 0 or a maximum logic 1 of the signal being passed through switches 11–18. Since the sine waves shown in FIGS. 4A and 4B could come from energy conserving inductor-capacitor (LC) tank circuits, use of toggle flip-flop 10 in this mode would yield an energy conservative two-phase dual-rail clock supply. A two-phase dual-rail clock supply is believed to be sufficient to construct complex reversible logic functions, suitable for computation.

Figure 5:
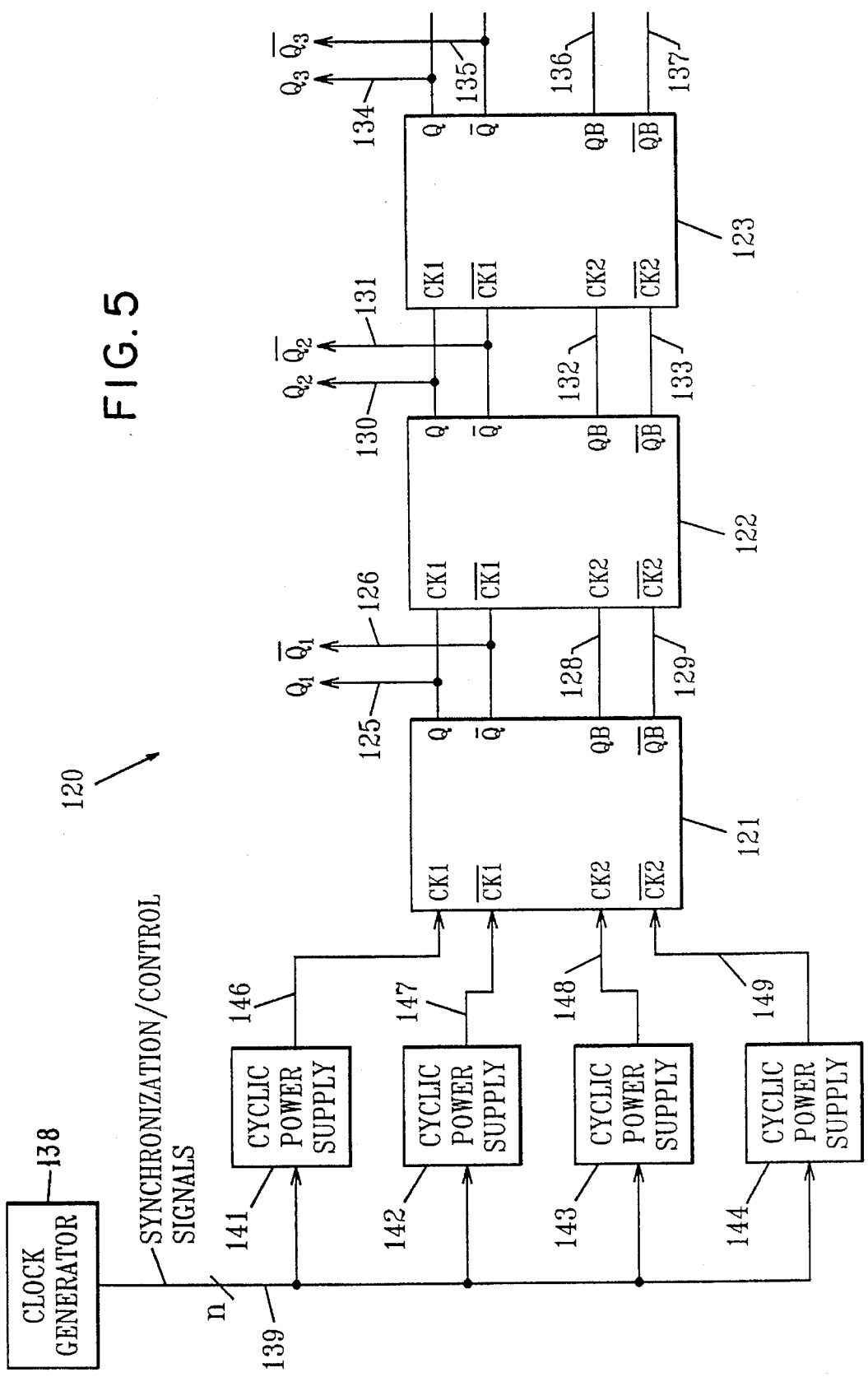
FIG. 5 is an alternate embodiment of the invention.

Referring now to FIG. 5, a three stage counter 120 is shown. In FIG. 5 like references are used for functions corresponding to the apparatus of FIG. 1. Counter stages 121–123 may consist of toggle flip-flop 10. The output signals Q and $\overline{Q}$ on leads 125 and 126 of counter stage 121 are coupled to input signals CK1 and $\overline{CK1}$ respectively of counter stage 122. The output signals QB and $\overline{QB}$ on leads 128 and 129 of counter stage 121 are coupled to input signals CK2 and $\overline{CK2}$ respectively of counter stage 122. The output signals of counter stage 122 on leads 130–133 are likewise coupled to the input signals of counter stage 123. The output signals Q, $\overline{Q}$, QB and $\overline{QB}$ of counter stage 123 are on leads 134–137, respectively. Additional counter stages may be added in the same manner as counter stage 123.

Lead or n leads 139 from clock generator 138 provide synchronization/control signals to an input of cyclic power supplies 141–144. The output of cyclic power supplies 141–144 provide signals CK1, $\overline{CK1}$, CK2 and $\overline{CK2}$ on leads 146–149 respectively to signal inputs CK1, $\overline{CK1}$, CK2 and $\overline{CK2}$ of counter stage 121. Typically, cyclic power supply 141 would provide both output signals CK1 and $\overline{CK1}$ thus eliminating the need for cyclic power supply 142 and likewise for cyclic power supply 143 eliminating the need for cyclic power supply 144. Three stage counter 120 will count down instead of up, or in reverse, by switching leads 146 and 147 with leads 148 and 149 respectively at the input of counter stage 121 or by changing the waveforms accordingly. Three stage counter 120 may also function as a divider.

Cyclic power supplies 141–144 may include a capacitor network or an inductor-capacitor network to recover energy back from counter stage 121 at times circuit nodes in counter stage 121 are ramped down or ramped up and the associated capacitance is discharged. The energy lost or dissipated is $CV^2RC/T$ where C is the value of the capacitance associated with the circuit node, V is the voltage change across the effective capacitor which may include stray capacitance of the circuit node, R is the effective resistance of the switch, and T is the time duration of the switching transistion. By using a cyclic power supply, the energy recovered is $$\frac{1}{2} CV^2 \left(1 - \frac{2RC}{T}\right).$$

Examples of networks or circuits suitable for cyclic power supplies 141–144 is given in a publication by L. J. Svensson et al., entitled "Adiabatic charging without inductors", IWLPD '94 Workshop Proceedings, pp. 159–164 and in a publication by Charles L. Seitz et al., entitled "Hot-Clock nMOS", 1985 Chapel Hill Conf. on VLSI, published by Conf. Sci. Press, pp. 1–17 which publications are incorporated herein by reference.

While there has been described and illustrated a toggle flip-flop circuit containing dual rail bi-directional switches and a counter, it would be apparent to those skilled in the art that modifications and variations are possible without deviating from the broad scope of the invention which shall be limited solely by the scope of the claims appended hereto.

Having thus described my invention, what I claim as new and desire to secure by Letters Patent is:

1. A low power toggle flip-flop comprising,
   three input terminals, CK1, $\overline{CK1}$, and CK2,
   two output terminals, Q and QB,
   four switches,
   said second and fourth switches connecting Q to CK1 and $\overline{CK1}$ respectively,
   said first and third switches connecting QB to CK1 and $\overline{CK1}$ respectively,
   said first switch controlled by signals on Q and CK2 such that it is closed only when both the signal on Q is a logic 0 and the signal on CK2 is a logic 0,
   said second switch controlled by signals on QB and CK2 such that it is closed only when both the signal on QB is a logic 0 and the signal on CK2 is a logic 1,
   said third switch controlled by signals on Q and CK2 such that it is closed only when both the signal on Q is a logic 1 and the signal on CK2 is a logic 0,
   said fourth switch controlled by signals on QB and CK2 such that it is closed only when both the signal on QB is a logic 1 and the signal on CK2 is a logic 1.

2. The circuit of claim 1, wherein said switches are field effect transistors.

3. The circuit of claim 1, wherein said switches are transmission gates, each transmission gate consisting of an n channel field effect transistor and a p channel field effect transistor connected in parallel.

4. A method for operating a low power toggle flip-flop with two input signals, CK1 and $\overline{CK1}$, where $\overline{CK1}$ is always the logic complement of CK1, and two output signals, Q and QB, comprising the following steps:
   (a) first, while CK1 is at logic 0, disconnecting one of CK1 and $\overline{CK1}$ from Q, and connecting QB to one of CK1 and $\overline{CK1}$ depending on whether Q=1 or =0, respectively,
   (b) second, ramping CK1 up to 1, thereby adiabatically charging QB to 1 if Q=1 or to 0 if Q=0,
   (c) third, disconnecting one of CK1 and $\overline{CK1}$ from QB, and connecting Q to one of CK1 and $\overline{CK1}$ depending on whether QB=1 or =0, respectively,
   (d) fourth, ramping CK1 back down to 0, thereby adiabatically charging Q to 0 if QB=1 or to 1 if QB=0 and wherein adiabatic charging includes using two more signals, CK2 and $\overline{CK2}$, to control the connecting and disconnecting in steps (a) and (c).

5. A toggle flip-flop circuit comprising:
   first through eight dual-rail biodirectional switches,
   each dual-rail bi-directional switch including a first and second transmission gate,
   said first transmission gate including a p and n channel field effect transistor, the drain of the p channel field effect transistor and the source of the n channel field effect transistor coupled together at a first terminal and the source of the p channel field effect transistor and the drain of the n channel field effect transistor coupled together at a second terminal,
   said second transmission gate including a p and n channel field effect transistor, the drain of the p channel field effect transistor and the source of the n channel field effect transistor coupled together at a third terminal and the source of the p channel field effect transistor and the drain of the n channel field effect transistor coupled together at a fourth terminal,
   each dual-rail bi-directional switch having first and second control inputs, said first control input coupled to the gate of the n channel field effect transistor of said first and second transmission gates, said second control input coupled to the gate of the p channel field effect transistor of said first and second transmission gates,
   said first, second, fourth and third dual-rail bi-directional switches coupled in series in a dual-rail ring by interconnecting first and second terminals of respective switches corresponding to a first rail and by interconnecting third and fourth terminals of respective switches corresponding to a second rail,
   the interconnection between said fourth and third dual-rail bi-directional switches adapted for coupling said first rail to an input signal CK1 and said second rail to an input signal $\overline{CK1}$, the interconnection between said first and second dual-rail bi-directional switches adapted for coupling said first rail to said input signal $\overline{CK1}$ and said second rail to said input signal CK1,
   the second rail interconnection between said second and fourth dual-rail bi-directional switches connected to the control input of said fifth dual-rail bi-directional switch and provides an output signal $\overline{Q}$ and the first rail interconnection connected to the control input of said seventh dual-rail bi-directional switch and provides an output signal Q, the second rail interconnection between said first and third dual-rail bi-directional switches connected to the control input of said sixth dual-rail bi-directional switch and provides an output signal $\overline{QB}$ and the first rail interconnection connected to the control input of said eighth dual-rail bi-directional switch and provides an output signal QB, input signals CK2 and $\overline{CK2}$ coupled through respective transmission gates of said eighth dual-rail bi-directional switch to said first and second control inputs of said fourth dual-rail bi-directional switch and through respective transmission gates of said sixth dual-rail bi-directional switch to said first and second control inputs of said second dual-rail bi-directional switch, and input signals $\overline{CK2}$ and CK2 coupled through respective transmission gates of said seventh dual-rail bi-directional switch to said first and second control inputs of said third dual-rail bi-directional switch and through respective transmission gates of said fifth dual-rail bi-directional switch to said first and second control inputs of said first dual-rail bi-directional switch.

6. The toggle flip-flop circuit of claim 5 wherein said toggle flip-flop is at least one stage of a counter, said counter having a plurality of stages.

7. The toggle flip-flop circuit of claim 5 further including a second toggle flip-flop circuit having first through eight dual-rail bi-directional switches, said second toggle flip-flop circuit interconnected with said toggle flip-flop circuit to form a counter.

8. The toggle flip-flop circuit of claim 5 further including a cyclic power supply coupled to one of said input signals CK1, $\overline{CK1}$, CK2 and $\overline{CK2}$, said cyclic power supply having a capacitor network for supplying a waveform and recovering energy from said one of said inputs.

9. The toggle flip-flop circuit of claim 8 wherein said cyclic power supply is responsive to a synchronization/ control signal from a clock generator.

10. The toggle flip-flop circuit of claim 5 further including a cyclic power supply coupled to one of said input signals CK1, $\overline{CK1}$, CK2 and $\overline{CK2}$, said cyclic power supply having a capacitor-inductor network for supplying a waveform and recovering energy from said one of said inputs.

11. The toggle flip-flop circuit of claim 10 wherein said cyclic power supply is responsive to a synchronization/ control signal from a clock generator.

* * * * *